United States Patent [19]
Lin et al.

[11] Patent Number: 6,102,232
[45] Date of Patent: Aug. 15, 2000

[54] EXPANDABLE MODULAR CONTAINER SYSTEM

[75] Inventors: Po-Chih Lin, Taipei, Taiwan; Lenny You; Lionel Luan, both of Shang-Hai, China

[73] Assignee: Inventec Corporation, Taipei, Taiwan

[21] Appl. No.: 09/389,382

[22] Filed: Sep. 3, 1999

[30] Foreign Application Priority Data

Sep. 5, 1998 [TW] Taiwan ................................. 87214681

[51] Int. Cl.⁷ .................................................. B65D 25/20
[52] U.S. Cl. ..................... 220/23.4; 361/732; 361/744; 439/292; 220/23.86
[58] Field of Search ................................. 220/23.4, 23.6, 220/23.2, 4.02, 23.83, 23.86; 361/732, 744; 174/52.1; 439/292, 717

[56] References Cited

U.S. PATENT DOCUMENTS

| | | | |
|---|---|---|---|
| 5,007,531 | 4/1991 | Lighten ................................. | 220/23.4 |
| 5,050,756 | 9/1991 | Tieucer et al. .......................... | 220/23.4 |
| 5,251,106 | 10/1993 | Hui ......................................... | 361/744 |
| 5,373,104 | 12/1994 | Brauer .................................... | 174/52.1 |
| 5,864,467 | 1/1999 | Recchia et al. ......................... | 220/23.4 |
| 5,988,394 | 11/1999 | Emoto et al. ........................... | 220/23.4 |

*Primary Examiner*—Joseph M. Moy
*Attorney, Agent, or Firm*—Birch, Stewart, Kolasch & Birch, LLP

[57] ABSTRACT

An expandable modular container system. A plurality of coupling pads supporting container modules are disposed between two supporting stands, wherein the coupling pads and supporting stands are coupled together, and the supporting stands are provided with supporting units to provide lateral support to the plurality of container modules. The container modules can be quickly and securely coupled side by side and in series by means of the plurality of coupling pads, thereby achieving a stable and space saving arrangement.

14 Claims, 4 Drawing Sheets

EXPANDABLE MODULAR CONTAINER SYSTEM

BACKGROUND OF THE INVENTION

1. Field of the Invention

The present invention relates to an expandable modular container system. More specifically, the invention relates to container modules of vertical type that can be quickly and securely coupled side by side and in series by means of a plurality of exterior coupling pads, thereby achieving a stable and space saving arrangement.

2. Description of Related Art

Conventionally, when a box device (for example, a networking hub or any other electronic device) of rectangular shape is vertically erected and placed side by side with other vertically erected box devices, the only supporting and fasting aid that each of these box devices can rely upon is a multiplicity of feet (usually four) or stands disposed directly underneath each of said devices. Such direct supports beneath the box devices are usually unstable due to the elevated center of gravity. If many vertically erected box devices are placed next to each other due to space limitations, a single push on one of the box devices might create a domino effect.

Furthermore, most conventional expandable modular container systems can only be locked in position for only one or two directions, thus the integrally formed coupling units of said box devices tend to slip occasionally. In addition, conventional coupled container modules are usually excessively complex in their coupling and overall structural design, so the cost of manufacturing is very high. As a result, the consuming public ends up paying a high cost in maintaining the system because it necessary to replace an entire container module even when only the coupling elements needs replacement.

SUMMARY OF THE INVENTION

Accordingly, it is an object of the present invention to provide a expandable modular container system in which modules can be quickly and securely coupled side by side and in series by means of a plurality of exterior coupling pads, thereby achieving a stable and space saving arrangement.

The expandable modular container system of this invention comprises: at least one vertical type container body having a bottom surface and top surface, a first vertical coupling clement being formed on the bottom surface; at least one coupling pad having a supporting surface, a first side coupling element, and a second side coupling element, wherein the first side coupling element of a first coupling pad can be coupled with the second coupling element of an adjacent second coupling pad; a second vertical coupling element disposed on the supporting surface of the coupling pad for coupling to the first vertical coupling element; a first supporting stand having a first base plate, a first supporting unit vertically disposed on the second base plate, and a third side coupling element for coupling to the first side coupling element; and a second supporting stand having a second base plate, a second supporting unit vertically disposed on the second base plate, and a fourth side coupling element for coupling to the second side coupling element; wherein, at least one coupling pad is coupled between the first supporting stand and the second supporting stand, and at least one container body is coupled to the at least one coupling pad.

A plurality of coupling pads can be coupled between the first supporting unit and the second supporting untill, and a plurality of container bodies can be coupled to the plurality of coupling pads, thereby achieving a stable and space saving arrangement of the container bodies.

Since adjacent coupling pads are securely locked together, the container bodies disposed on the coupling pads are kept square and stable. Further, the supporting stands provide lateral support and protect the sides from damage caused by accidental collision. Since only one type of coupling pad and container bodies are used, it is relatively cheap and easy to maintain the entire expandable modular container system. In the case of a failed coupling, all is required is a replacement of the coupling pad. Moreover, the expandable container module is truly flexible in the sense that each of the container modules, including the electronic device within the modules, can be separated from the rest without much effort and replaced by a container body containing a different device.

BRIEF DESCRIPTION OF THE DRAWINGS

Other objects, features, and advantages of the present invention will become apparent from the following detailed description of the preferred but non-limiting embodiment. The description is made with reference to the accompanying drawings in which.

DETAILED DESCRIPTION OF THE PREFERRED EMBODIMENT

Figure 1:
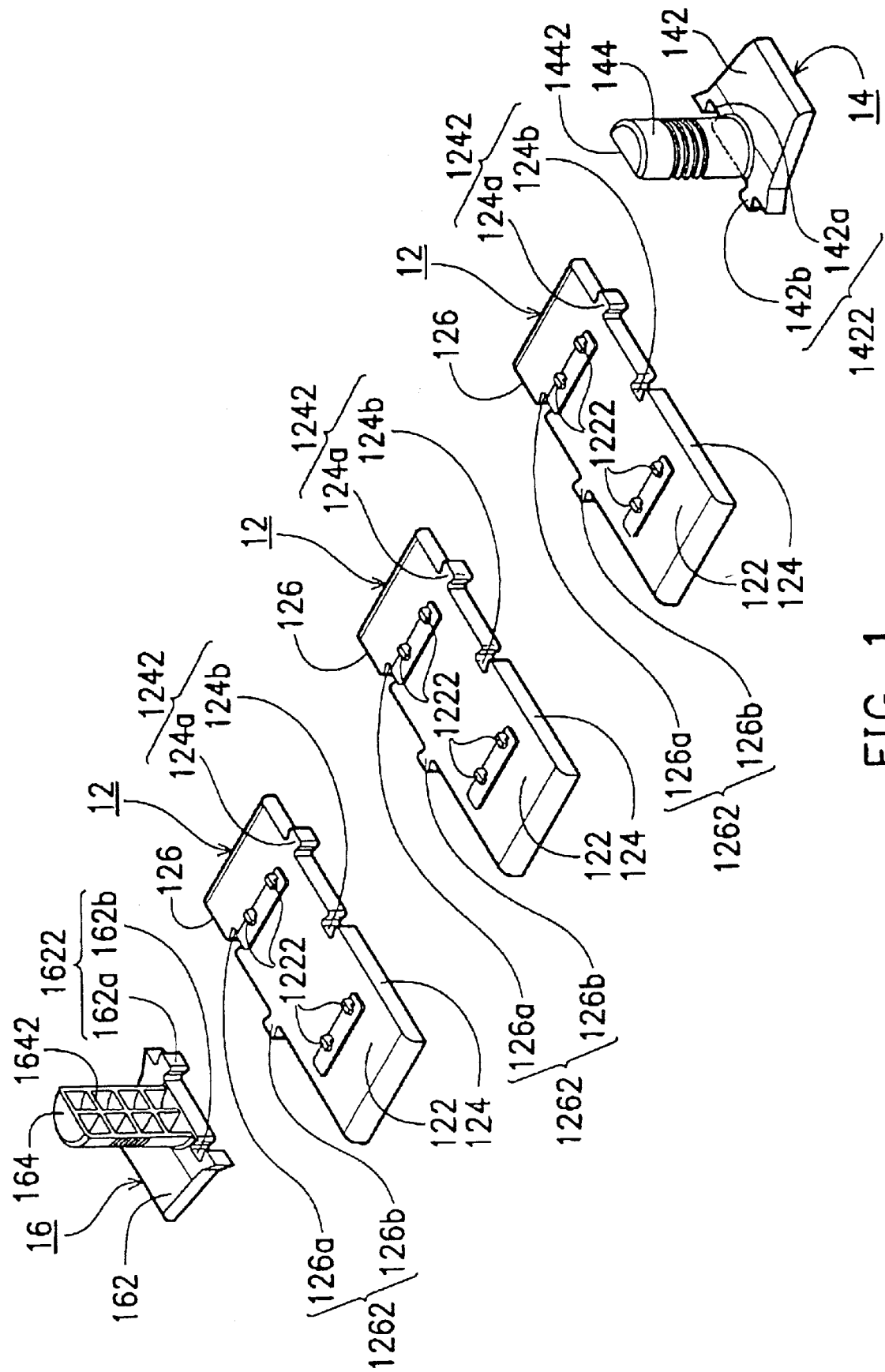
FIG. 1 shows a perspective view of uncoupled vertical type expandable container modules excluding the container bodies.
Figure 2:
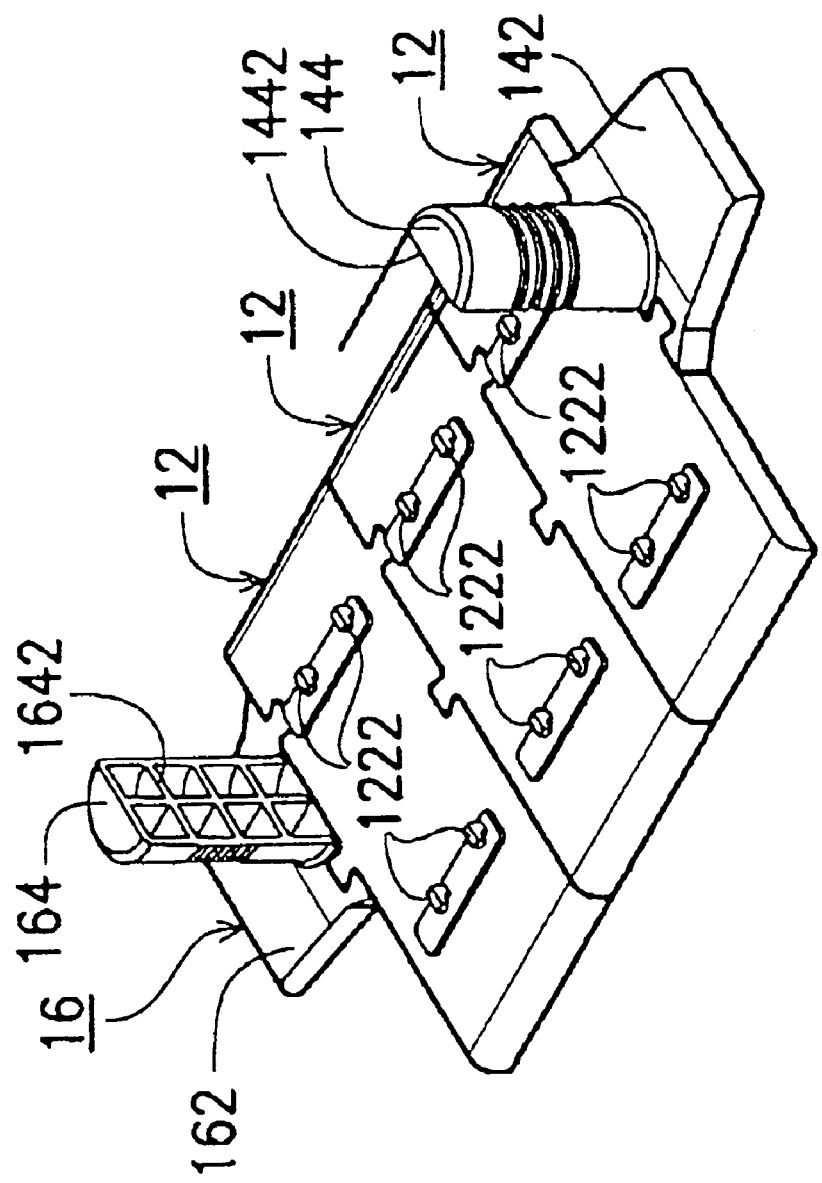
FIG. 2 is a perspective view of vertical type expandable container modules coupled together without the container bodies.
Figure 3A:
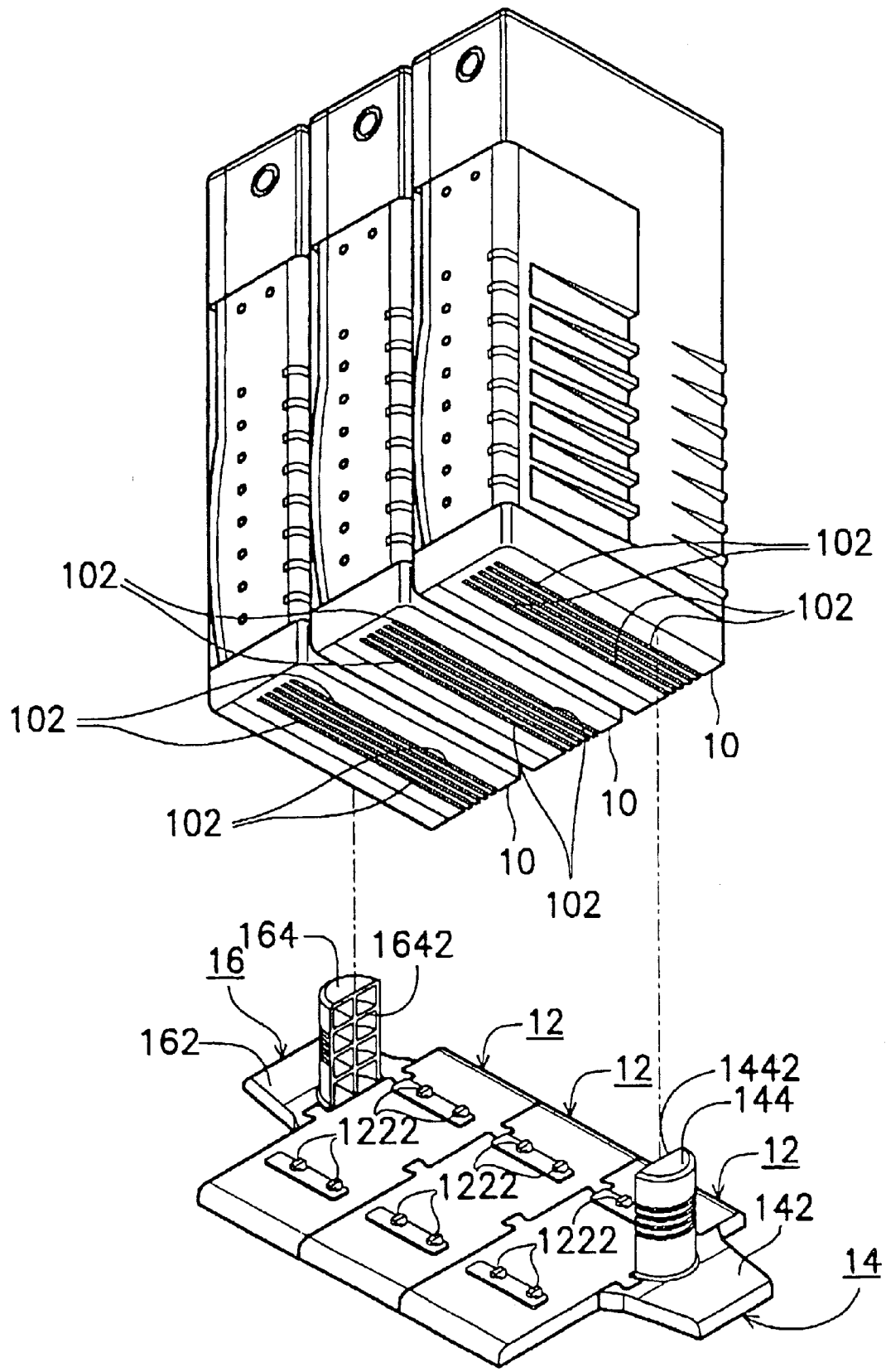
FIG. 3a is a perspective view of vertical type expandable container modules and container bodies prior to coupling.
Figure 3B:
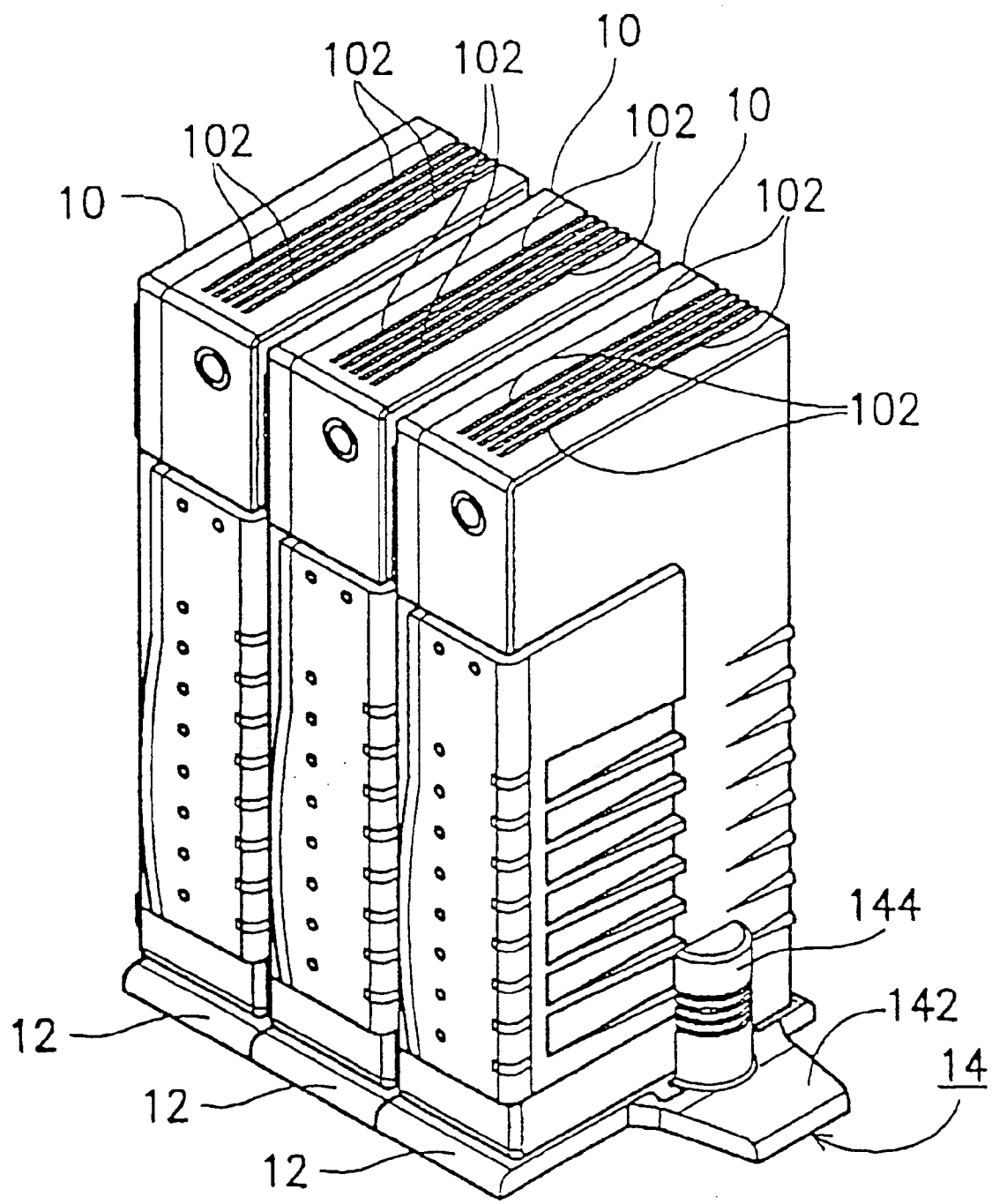
FIG. 3b is a perspective view of vertical type expandable container modules with the container bodies coupled thereto.

Please refer to FIGS. 1, 2, and 3a and b. The expandable modular container system of the present invention provides a vertical type container body 10, for enclosing networking hubs or any other electronic devices, having at least a coupling slot set 102 on a bottom surface of the container body 10, wherein each said coupling slot set 102 can comprise, for example, four identical slots as shown in FIG. 3a. An identical coupling slot set 102 can also be formed on the top surface or the container body as shown in 3b.

Furthermore, the expandable modular container system of the present invention comprises at least one coupling pad 12 having an integrally formed supporting surface 122, first side coupling element 1242, and second side coupling element 1262. At least a hook set 1222 is formed on said supporting surface for connection to said coupling slot set 102. Further, each of said first side coupling elements includes at least a protrusion 124a and a recess part 124b such that the protrusion part 124a can be embraced by a recess part 124b of another separate but adjoining coupling pad 12. The protrusions of each of the side coupling elements can be of any contour shape as long as the tip, or head portion, is somewhat larger than the neck portion, and the recess of each of the side coupling elements matches the contour shape of the protrusions. As shown in FIG. 1, each of said first side coupling elements 1242 can be adjoined and coupled to either a said second side coupling element 1262, and each of said second side coupling elements 1262 can he adjoined and coupled to either a said first side coupling element 1242. Thus, more than two vertical type expandable container modules can be adjoined side by side to form a series.

Note, to achieve an even more stable coupling of container modules, additional coupling pads may be coupled to the coupling slot set 102 on the top surface of the container body by inverting the coupling pads.

In addition, the expandable modular container system of the present invention comprises a first supporting stand 14 having a first base plate 142, a first supporting unit 144, and a third side coupling element 1422 for coupling to said first side coupling element 1242 of a coupling pad. The coupling between the first supporting stand and a coupling pad is done by putting the protrusion 142*b* in the recess part 124*b* and 124*a* in 142*a*.

In addition, the expandable modular container system of the present invention comprises a second supporting stand 16 having a second base plate 162, a second supporting unit 164, and a fourth side coupling element 1622 for coupling to said second side coupling element 1262 of a coupling pad. The coupling between the second supporting stand and a coupling pad is done by putting the protrusion 162*a* in the recess part 126*a* and 162*b* in 126*b*.

The first and second supporting units of said first and second supporting stands can be of semi-cylindrical shape. Further, the first and the second supporting stands can be identical parts. Said first and second supporting stands are each coupled to one of the two outermost coupling pads, said coupling pads still having container bodies attached on top, by means the side coupling elements in order to provide some lateral support to the expandable modular container system.

The expandable modular container system of the present invention allows for flexible addition or subtraction of container modules by simple addition or subtraction of coupling pads and container bodies disposed thereon. The interlocking of adjacent coupling pads and the first and second supporting stands provides a stable and compact disposition of the container modules.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A expandable modular container system comprising:

at least one container body having a bottom surface and top surface;

a first vertical coupling element formed on the bottom surface of the at least one container body;

at least one coupling pad having a supporting surface, a first side coupling element, and a second side coupling element, wherein the first side coupling element of a first coupling pad can be coupled with the second coupling element of an adjacent second coupling pad;

a second vertical coupling element disposed on the supporting surface of the at least one coupling pad for coupling to the first vertical coupling element;

a first supporting stand having a first base plate and a third side coupling element for coupling to the first side coupling element; and a second supporting stand having a second base plate and a fourth side coupling element for coupling to the second side coupling element;

wherein, at least one coupling pad is coupled between the first supporting stand and the second supporting stand, and at least one container body is coupled to the at least one coupling pad.

2. The expandable modular container system as claimed in claim 1, wherein a plurality of coupling pads are coupled between the first supporting unit and the second supporting unit, and a plurality of container bodies are coupled to the plurality of coupling pads.

3. The expandable modular container system as claimed in claim 1, wherein the first vertical coupling element comprises at least one slot.

4. The expandable modular container system as claimed in claim 3, wherein the first vertical coupling element comprises four identical slots.

5. The expandable modular container system as claimed in claim 3, wherein the second vertical coupling element comprises at least one hook receivable in the at least one slot.

6. The expandable modular container system as claimed in claim 4, wherein the second vertical coupling element comprises four hooks receivable in the four slots, respectively.

7. The expandable modular container system as claimed in claim 1, wherein said first, second, third and fourth side coupling elements each includes at least a protrusion and a recess, wherein the protrusion is shaped to be embraced by the corresponding recess of an adjoining side coupling element.

8. The expandable modular container system as claimed in claim 7, wherein the protrusions is shaped with a large head portion and a small neck portion.

9. The expandable modular container system as claimed in claim 1, wherein the first and the second supporting stands are both of semi-cylindrical shape.

10. The expandable modular container system as claimed in claim 1, wherein a third vertical coupling element identical to the first vertical coupling element is formed on the top surface of the container body for coupling to inverted coupling pads.

11. The expandable modular container system as claimed in claim 1, wherein the first and second side coupling elements are integrally formed to the coupling pad.

12. The expandable modular container system as claimed in claim 1, wherein the third and fourth side coupling elements are formed integrally to the first and second supporting units, respectively.

13. The expandable modular container system as claimed in claim 1, wherein the container body is of vertical type.

14. The expandable modular container system as claimed in claim 1, wherein a first supporting unit and a second supporting unit are vertically disposed on the first base plate and the second base plate of the first supporting stand and the second supporting stand, respectively, so as to provide lateral support to container bodies disposed therebetween.

* * * * *